(12) United States Patent
Uzawa

(10) Patent No.: US 6,342,942 B1
(45) Date of Patent: Jan. 29, 2002

(54) EXPOSURE APPARATUS, EXPOSURE CONTROL METHOD, AND DEVICE FABRICATION METHOD USING THE EXPOSURE APPARATUS

(75) Inventor: Shigeyuki Uzawa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/342,539

(22) Filed: Jun. 29, 1999

(30) Foreign Application Priority Data

Jun. 30, 1998 (JP) .......................................... 10-184045

(51) Int. Cl.⁷ ........................ G03B 27/42; G03B 27/32; G01B 11/00
(52) U.S. Cl. .......................... 355/53; 355/77; 356/399
(58) Field of Search .............................. 355/53, 40, 50, 355/55, 77; 356/399, 400, 401

(56) References Cited

U.S. PATENT DOCUMENTS

| | | | | |
|---|---|---|---|---|
| 5,477,304 A | * | 12/1995 | Nishi | ........................... 355/53 |
| 5,617,182 A | * | 4/1997 | Wakamoto et al. | ........... 355/53 |
| 5,793,471 A | | 8/1998 | Kanda et al. | |
| 6,040,892 A | * | 3/2000 | Pierrat | .......................... 355/53 |

FOREIGN PATENT DOCUMENTS

| | | |
|---|---|---|
| JP | 1-188241 | 7/1989 |
| JP | 3-245932 | 11/1991 |
| JP | 5-77126 | 3/1993 |
| JP | 5-121294 | 5/1993 |
| JP | 6-267823 | 9/1994 |

* cited by examiner

Primary Examiner—Russell Adams
Assistant Examiner—Peter B Kim
(74) Attorney, Agent, or Firm—Fitzpatrick, Cella, Harper & Scinto

(57) ABSTRACT

An exposure apparatus includes a reticle stage for holding a reticle, a wafer stage for holding a wafer, and projection optical system for projecting a pattern of the reticle onto the wafer. The apparatus performs exposure by scanning both the reticle stage and the wafer stage with respect to the projection optical system, thereby transferring the pattern of the reticle onto a plurality of shot regions on the wafer in order. A plurality of shot regions arranged in a scanning direction on the wafer are intermittently exposed in order by scanning by moving the wafer stage without stopping it and skipping one or more shot regions without exposing them. In this skip period, the reticle stage is returned in the opposite direction to the direction of the scanning.

47 Claims, 12 Drawing Sheets

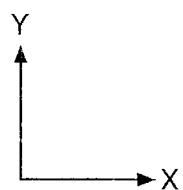
FIG. 8
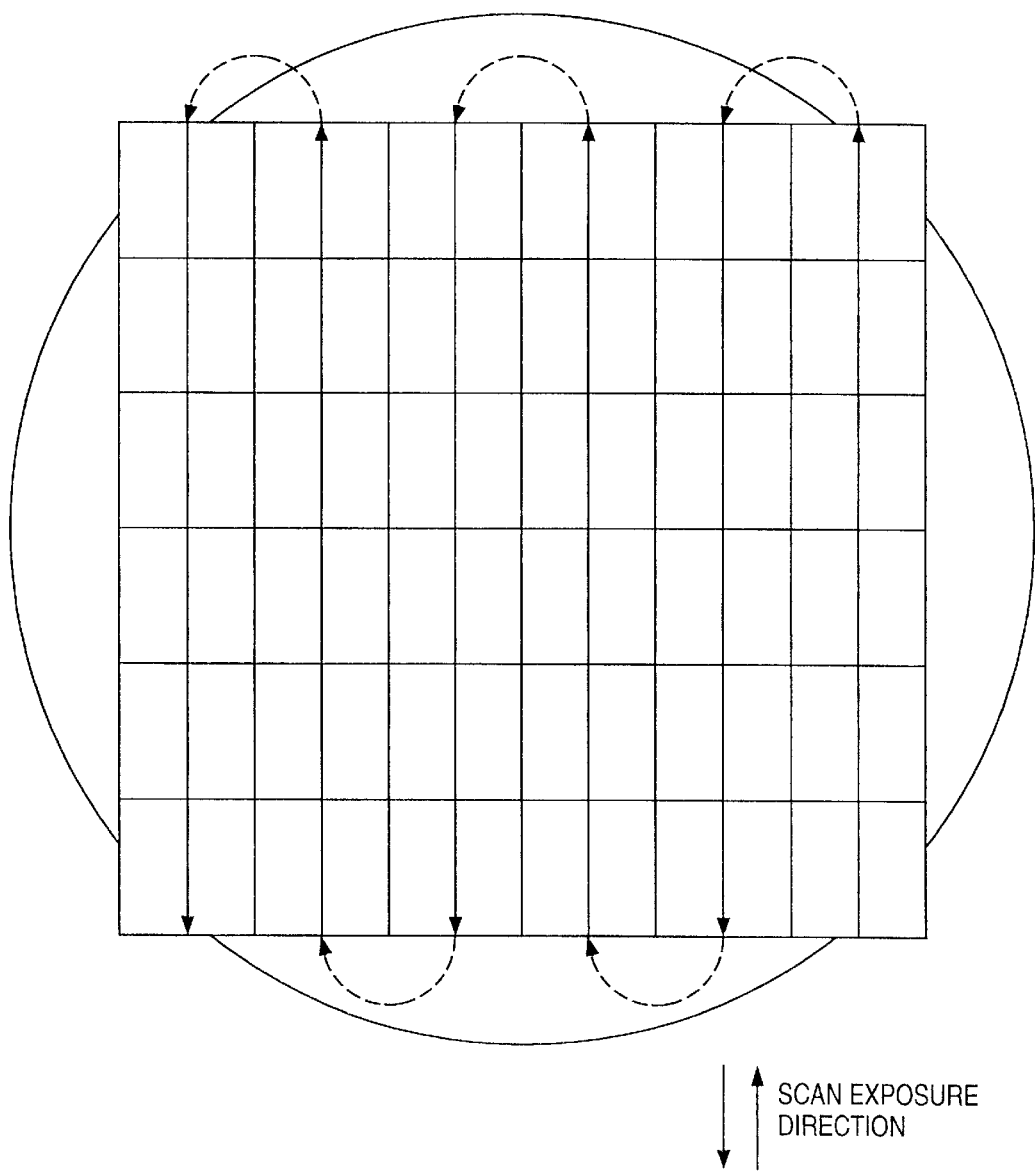
SCAN EXPOSURE
DIRECTION

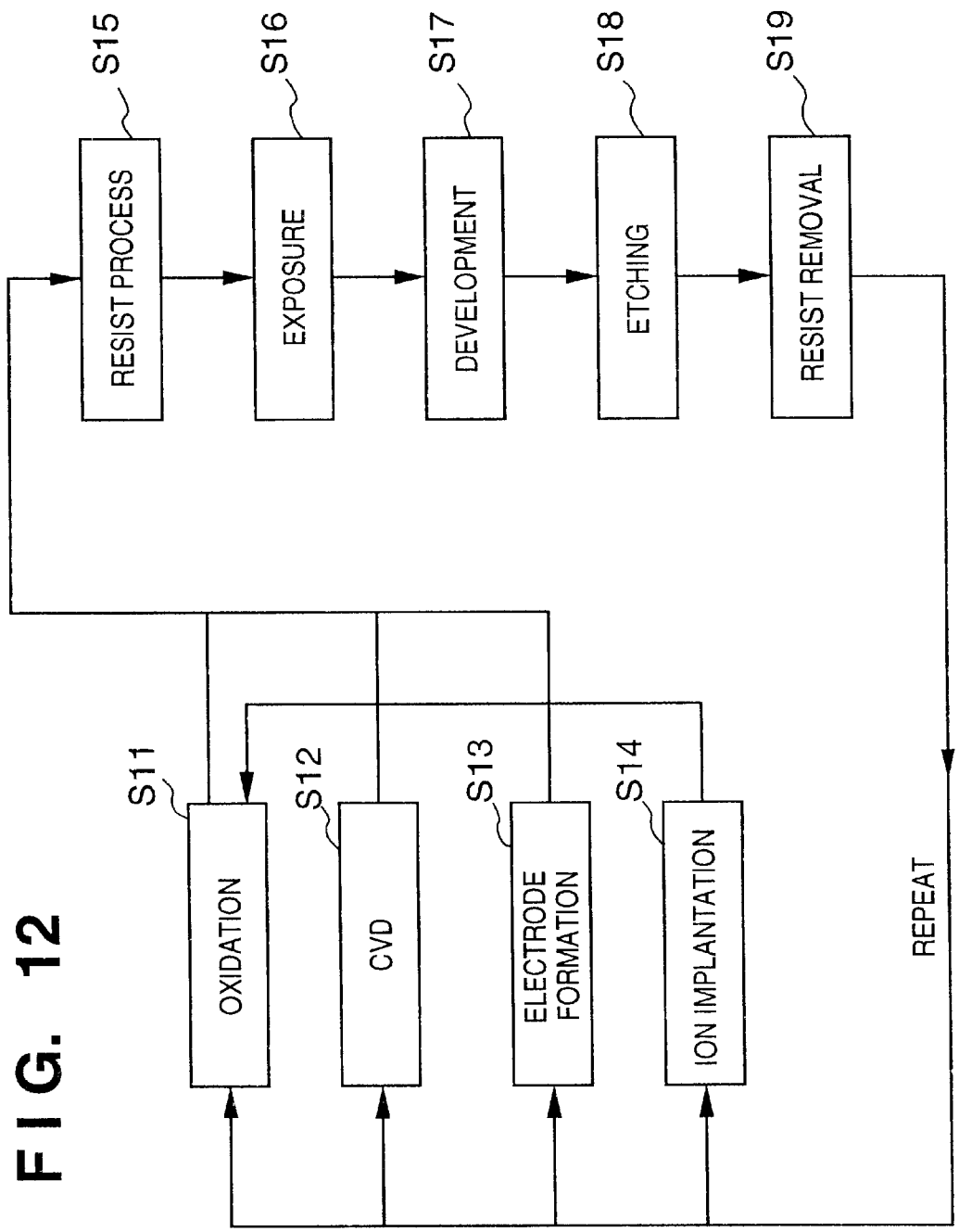

EXPOSURE APPARATUS, EXPOSURE CONTROL METHOD, AND DEVICE FABRICATION METHOD USING THE EXPOSURE APPARATUS

BACKGROUND OF THE INVENTION

1. Field of the Invention

The present invention relates to an exposure apparatus for use in, e.g., a semiconductor lithography process, a stage apparatus suitable for this exposure apparatus, and a device fabrication method.

2. Description of the Related Art

Representative conventional exposure apparatuses for use in the fabrication of semiconductor devices and the like are a step-and-repeat exposure apparatus (also called a stepper) and a step-and-scan exposure apparatus (also called a scanner). The step-and-repeat exposure apparatus moves a substrate (wafer or glass substrate) step by step and sequentially transfers a pattern of an original plate (reticle or mask) onto a plurality of exposure regions on the substrate by exposure via a projection optical system. The step-and-scan exposure apparatus repeats step movement and scan exposure and thereby repeats exposure transfer onto a plurality of regions on a substrate. In particular, the step-and-scan exposure apparatus uses only a portion of a projection optical system, which is relatively close to the optical axis, by restriction using a slit, and hence can expose fine patterns with high accuracy at a wide field angle. Therefore, this step-and-scan exposure apparatus is expected to be prevalent in the future.

This exposure apparatus has stage apparatuses (a wafer stage and reticle stage) for rapidly moving a wafer and reticle and positioning them. However, driving the stage produces the counterforce of inertia force resulting from acceleration and deceleration. If this counterforce is transmitted to a surface plate, the surface plate shakes or vibrates. Consequently, the natural oscillation of the mechanism of the exposure apparatus is excited to generate high-frequency vibration. This may interfere with high-speed, high-accuracy positioning.

Several proposals have been made to solve this problem of the counterforce. For example, in an apparatus described in Japanese Patent Laid-Open No. 5-77126, the stator of a linear motor for driving a stage is supported by the floor independently of a stage surface plate, thereby preventing shaking of the stage surface plate caused by the counterforce. Also, in an apparatus described in Japanese Patent Laid-Open No. 5-121294, a force actuator for generating force in the horizontal direction with respect to a machine frame supporting a wafer stage and projecting lens applies compensating force equivalent to counterforce produced by driving of the stage. This reduces shaking of the apparatus caused by the counterforce.

In either of the above conventional apparatuses, however, although shaking of the stage apparatus itself can be reduced, the counterforce produced by driving the stage is transmitted to the floor directly or via a member which is regarded as being substantially integrated with the floor. Since this counterforce vibrates the floor, apparatuses arranged around the exposure apparatus may be given vibrations and adversely affected. Generally, the floor on which the exposure apparatus is installed has a natural frequency of about 20 to 40 Hz. Therefore, if this natural frequency of the floor is excited by the operation of the exposure apparatus, the adverse effect on the peripheral apparatuses is enormous.

Recently, the stage acceleration is increasing steadily with the improvement of the processing speed (throughput). For example, the maximum stage acceleration of the step-and-scan exposure apparatus is 4 G for a reticle stage and 1 G for a wafer stage. Additionally, the stage mass is also increasing with the increase in size of a reticle and substrate. Accordingly, the driving force defined by <mass of moving body>×<acceleration> becomes very large, and its counterforce is very large. Hence, the vibration of the installation floor caused by the acceleration increase and weight increase is a problem to be solved.

SUMMARY OF THE INVENTION

The present invention has been made to solve the above problem, and has as its object to provide an exposure apparatus obtained by further advancing the above conventional apparatuses.

It is another object of the present invention to provide an exposure apparatus capable of particularly reducing the influence of vibration or shaking caused by the movement of a wafer stage and achieving higher accuracy than in the conventional apparatuses, and also improving the throughput.

It is still another object of the present invention to provide an exposure apparatus capable of reducing the influence of the counterforce produced by the acceleration and deceleration of a wafer stage on the floor, and thereby reducing the influence on other apparatuses installed on the same floor.

It is still another object of the present invention to provide a device fabrication method using the above exposure apparatus and having high productivity.

One form of the exposure apparatus of the present invention which solves the above conventional problem is an exposure apparatus comprising a reticle stage for holding a reticle, a wafer stage for holding a wafer, and a projection optical system for projecting a pattern of the reticle onto the wafer. This exposure apparatus performs exposure by scanning both the reticle stage and the wafer stage with respect to the projection optical system, and transfers the reticle pattern onto a plurality of shot regions on the wafer in order. The apparatus is characterized in that the plurality of shot regions arranged along a scanning direction on the wafer are intermittently exposed by moving the wafer stage by scanning without stopping it.

Preferably, the shot regions arranged in the scanning direction are exposed by scanning in order while one or more shot regions are skipped without being exposed. Preferably, the reticle stage is moved in the opposite direction to the direction of scanning during the skip period. Preferably, the skipped shot regions are similarly exposed later while the exposed shot regions are skipped.

Preferably, the velocity of the wafer stage is held constant during the scan exposure and the skip period, or, the velocity of the wafer stage during the skip period is changed from that during the scan exposure.

Preferably, alignment measurement or focus measurement is performed during the skip period. The measurement result is reflected on exposure of the next shot or an adjacent shot. Alternatively, the apparatus includes a means for storing the measurement result, and the measurement result is reflected when the skipped shot regions are exposed later. Also, alignment is performed for each shot by a die-by-die mode, or this position information of each shot is added to position information of the shot previously obtained by global alignment.

Preferably, multiple exposure is performed for each shot region by using a plurality of wafers. For example, this multiple exposure is performed by using a first reticle for transferring a line-and-space periodic pattern and a second reticle for transferring an isolated pattern. For example, after the first reticle is exposed, the interval to exposure of the second reticle is held substantially constant for all shot regions. For example, the line-and-space pattern is exposed by the first reticle by moving the wafer stage while the reticle stage is stopped.

Another form of the exposure apparatus of the present invention is a scanning exposure apparatus for performing multiple exposure of first and second patterns. This exposure apparatus is characterized in that scan exposure is performed by moving a wafer stage while a reticle stage is stopped during the exposure of the first pattern, and scan exposure is performed by moving both the reticle stage and the wafer stage during the exposure of the second pattern.

Preferably, the apparatus includes a mechanism for reducing the influence of counterforce produced when the wafer stage or the reticle stage is driven. This mechanism is constructed of a stage base member for supporting the wafer stage, and a counterforce receiving structure, different from the stage base member, for receiving the counterforce produced when the stage is driven. Transmission of vibrations having a predetermined frequency or more is interrupted between the counterforce receiving structure and the floor.

The device fabrication method of the present invention is characterized by fabricating devices by fabrication steps including the step of preparing any of the abovementioned exposure apparatuses and the step of performing exposure by using the exposure apparatus.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 8 is a view for explaining the step-and-scan operation sequence of another embodiment;

FIG. 12 is a flow chart showing details of a wafer process.

DETAILED DESCRIPTION OF THE PREFERRED EMBODIMENTS

Preferred embodiments of the present invention will now be described in detail in accordance with the accompanying drawings.

Figure 1:
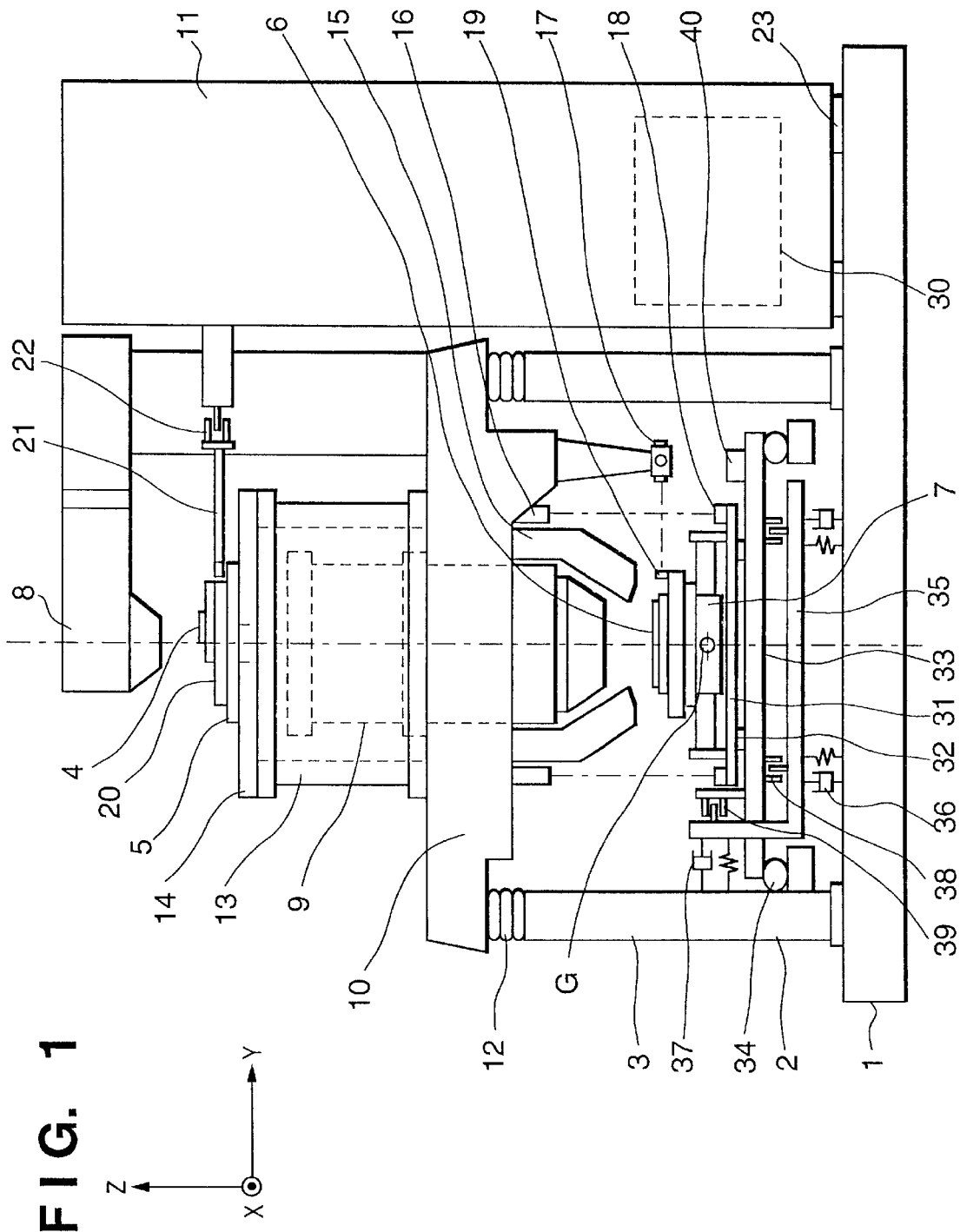
FIG. 1 is a view showing the whole construction of an exposure apparatus according to an embodiment.

FIG. 1 is a schematic view of an exposure apparatus for fabricating semiconductor devices according to one embodiment of the present invention. This embodiment relates to a so-called step-and-scan type scanning exposure apparatus which transfers a reticle pattern onto one shot region on a wafer by exposure while synchronously scanning the reticle and the wafer and transfers the pattern onto a plurality of shot regions by moving the wafer step by step.

Referring to FIG. 1, this apparatus roughly includes a base frame 2, a reticle stage 5, a wafer stage 7, an illuminating optical system 8, a projection optical system 9, a lens barrel surface plate 10, and an air-conditioning machine room 11. The base frame 2 is the foundation of the exposure apparatus main body. The reticle stage 5 can move while mounting a reticle 4 to be exposed. The wafer stage 7 can move while mounting a wafer 6 (or a glass substrate) to be exposed. The illuminating optical system 8 illuminates the reticle 4 with illuminating light. The projection optical system 9 projects a pattern of the reticle 4 onto the wafer 6 by reducing the pattern at a predetermined magnification (e.g., 4:1). The lens barrel surface plate 10 holds this projection optical system 9. The air-conditioning machine room 11 supplies temperature-controlled clean air.

The illuminating optical system 8 has a built-in light source (a discharge lamp such as an ultra-high-pressure mercury lamp) or introduces a beam line, as illuminating light, from a light source apparatus (excimer laser apparatus, not shown) placed on the floor independently of the exposure apparatus. The illuminating light source 8 forms slit light by various lenses and stops and illuminates the reticle 4 as an original plate held on the reticle stage 5 with this slit light from the above. The illuminating light source 8 also includes a light-shielding member (e.g., a variable blind, masking blade, or shutter) for shielding exposure light when no exposure is performed, and hence can control irradiation of the exposure light.

The base frame 2 is installed on an installation floor 1 of a clean room in a semiconductor fabrication plant. This base frame 2 is fixed with high rigidity to the installation floor 1 and can be substantially regarded as being integrated with the installation floor 1 or as the extension of the installation floor 1. The base frame 2 has three or four rigid columns 3. The upper portions of these base frame columns 3 vertically support the lens barrel surface plate 10 via (three or four) active mounts 12. Each active mount 12 includes an air spring, damper, and actuator. This active mount 12 prevents the transmission of high-frequency vibrations from the installation floor 1 to the lens barrel surface plate 10 and actively compensates for inclination or shaking of the lens barrel surface plate 10.

The lens barrel surface plate 10 for holding the projection optical system 9 also supports a reticle stage surface plate 14 via a reticle stage support frame 13. An alignment detector 15 for detecting the alignment between the reticle 4 and the wafer 6 is attached to the lens barrel surface plate 10 to perform alignment with reference to the lens barrel surface plate 10. Additionally, laser interferometers are attached to the lens barrel surface plate 10 to detect the position of the wafer stage 7 with reference to the lens barrel surface plate 10. That is, a Z interferometer 16 measures the position of the wafer stage 7 in a Z direction, and an X-Y interferometer 17 measures the position of the wafer stage 7 in an X-Y direction. As reference mirrors of these interferometers, a Z interferometer mirror 18 is fixed to a wafer stage surface plate 31, and an X-Y interferometer mirror 19 is fixed to the wafer stage 7. The Z interferometer mirror 18 is attached to the wafer stage surface plate 31, instead of a stage base member 33, because the wafer stage surface plate 31 is close to the stage to be finally positioned. Also, although the stage base member 33 may slightly deform when a force actuator is operated, the wafer stage surface plate 31 is less influenced by this force actuator and allows accurate measurements.

The reticle stage 5 is installed on the reticle stage surface plate and moved in the order of acceleration, constant velocity, and deceleration from the left to right (Y direction) in FIG. 1 during scan exposure by a driving mechanism including a driving source 20 (linear motor) and a static pressure bearing. As will be described later, the stator of the driving source 20 (linear motor) of the reticle stage 5 is connected along the scanning direction to the air-conditioning machine room 11 as a reticle stage counterforce receiving structure via a connecting member 21 and a force actuator 22 (linear motor). Variable thrust generated by this force actuator 22 can be transmitted between the driving source 20 and the air-conditioning machine room 11.

The wafer stage and its periphery characterizing this embodiment will be described below. The wafer stage 7 mounts the wafer 6 as a substrate on its upper surface. The wafer stage 7 can move the mounted wafer 6 in the horizontal direction (X-Y direction) and the vertical direction (Z direction) and rotate the wafer 6 around these directions ($\omega x$, $\omega y$, and $\omega z$). That is, the wafer stage 7 can position the wafer 6 in a total of six axis directions. The wafer stage 7 uses linear motors as driving sources for the positioning. Basically, the wafer stage 7 has a two-dimensional stage including an X stage and X linear motor moving straight in the X direction and a Y stage and Y linear motor moving in the Y direction perpendicular to the X direction. A stage which can move in the Z direction, tilt ($\omega x$ and $\omega y$), and rotate is mounted on this two-dimensional stage. A static pressure bearing is used as a guide in each direction. More detailed arrangements of the wafer stage 7 are described in, e.g., Japanese Patent Laid-Open Nos. 1-188241, 3-245932, and 6-267823.

The wafer stage 7 is supported by the wafer stage surface plate 31 and moved on an X-Y horizontal guide surface (guide surface) of the wafer stage 31. Three (or four) support legs 32 support the wafer stage surface plate 31 on the stage base member 33. This support leg 32 is highly rigid and has no damping function. The base frame 2 vertically supports three portions of the stage base member 33 via three mounts 34. Basically, these three mounts 34 support most load of the stage base member 33 and of the members mounted on it, and the base frame 2 substantially integrated with the installation floor 1 receives this load received by the mounts 34. Therefore, the installation floor 1 equivalently supports the basic load of the wafer stage 7. Air springs capable of supporting a large load are used as the mounts 34.

A counterforce receiving structure 35 (counterforce receiving pallet) having a large mass is placed immediately below the stage base member 33. Since this counterforce receiving structure 35 is positioned below the stage base member 33, the installation area occupied by the apparatus on the installation floor 1 can be reduced.

In the vertical direction, four vertical elastic supports 36 support the counterforce receiving structure 35 on the installation floor 1. In the horizontal direction, horizontal elastic supports 37 arranged in the X and Y directions (only one horizontal elastic support 37 in the Y direction is shown in FIG. 1) support the counterforce receiving structure 35 with respect to the circumferential surfaces of the base frame columns 3 of the stage base member 33 (or to the side surfaces of members fixed on the installation floor 1). Each of these vertical and horizontal elastic supports 36 and 37 has a spring element and a damper element. For example, a rubber vibration insulator, air spring, spring, or leaf spring is suitable for the spring element, and oil viscosity or electromagnetic fluid is suitable for the damper element. Having the spring element and the damping element is equivalent to having a mechanical filter function of interrupting the transmission of vibrations within a predetermined frequency range. In this embodiment, the transmission of high-frequency vibrations including at least the natural frequency of the floor and the natural frequency of the apparatus is interrupted. Referring to FIG. 1, the horizontal elastic support 37 is placed between the counterforce receiving structure 35 and the base frame column 3 of the base frame 2. However, this horizontal elastic support 37 can also be placed between a member fixed on the installation floor 1 and the counterforce receiving structure 35.

Force actuators for generating thrust in the vertical and horizontal directions are interposed between the stage base member 33 and the counterforce receiving structure 35. More specifically, the apparatus has a plurality of (four) vertical force actuators 38 for generating thrust in the vertical direction and a plurality of (two) horizontal force actuators 39 for generating thrust in the horizontal direction, i.e., in each of the scan exposure direction (Y direction) and the direction (X direction) perpendicular to the scan exposure direction. When viewed from the above, the four vertical force actuators 38 are arranged in substantially the same positions as the four vertical elastic supports 36. Variable thrust generated by these force actuators allows control of force transmission between the actuators and the supports. The height of the center of gravity (indicated by a center of gravity G in FIG. 1) is substantially equal to the height of the force acting position of the horizontal force actuator 39. Since the compensating force can be applied to the same level as the counterforce, the counterforce can be effectively canceled.

Furthermore, an acceleration sensor 40 is mounted on the stage base member 33 to measure the vertical and horizontal (Y direction) accelerations. This acceleration sensor 40 can also be mounted on the wafer stage surface plate 31.

In this embodiment, linear motors are used as the force actuators for the reasons to be explained below. That is, a linear motor has high control response, so the generated force can be rapidly controlled. Additionally, the rotor and stator of a linear motor are not in contact with each other, and Lorentz force acts between these members. Therefore, while the non-contact state is held by Lorentz force, the driving counterforce of the stage can be transmitted from the stage base member 33 to the counterforce receiving structure 35. Also, this non-contact linear motor has a mechanical filter function of interrupting vibration transmission. That is, a linear motor has functions of both a non-contact actuator and a mechanical filter and hence is very suited to this system. Instead of this linear motor using Lorentz force, it is also possible to use an electromagnetic actuator using electromagnetic force, a fluid actuator using fluid pressure such as air pressure or oil pressure, or a mechanical actuator using a piezoelectric element, as the force actuator.

In this system, the active mounts 12 support the reticle stage 5 and projection optical system 9, which are substantially integrated by the lens barrel surface plate 10, substantially perpendicularly to the installation floor 1 via the base frame columns 3 of the base frame 2. The mounts 34 support the wafer stage 7 and the stage base member 33 substantially perpendicularly to the installation floor 1 via the base frame 2. Assuming that this mount 34 is a first mount and the active mount 12 is a second mount, these first and second mounts support the wafer stage 7 and the reticle stage 5 independently of each other with respect to the installation floor 1. So, the wafer stage 7 and the reticle stage 5 do not interfere with each other when vibrations or shaking occurs.

Also, the mounts 34 support the stage base member 33 perpendicularly to the installation floor 1, and the elastic vertical supports 36 support the counterforce receiving structure 35 substantially perpendicularly to the installation floor 1. Therefore, the stage base member 33 and the counterforce receiving structure 35 are independently supported on the floor except for the vertical and horizontal force actuators (38 and 39).

The air-conditioning machine room 11 as the reticle stage counterforce receiving structure is supported on the installation floor 1 via elastic supports 23 having a damping function. These elastic supports 23 can also be regarded as mechanical filters and interrupt the transmission of high-frequency vibrations including at least the natural frequency (e.g., 20 to 40 Hz) of the floor and the natural frequency (e.g., 10 to 30 Hz) of the exposure apparatus.

The air-conditioning machine room 11 contains, e.g., an air fan, temperature controller (heater or freezer), and chemical filter and circulates a temperature-controlled gas into the exposure apparatus chamber. A controller 30 of the exposure apparatus is internally stored in the lower space of the air-conditioning machine room 11. This controller 30 controls the operation sequence of the exposure apparatus, the driving of the force actuators, and the driving of the active mounts.

<Description of Operation>

The operation of the exposure apparatus with the above arrangement will be described below. The basic operation sequence of the step-and-scan is to repeat a step operation of positioning a shot region as a target of transfer by moving the wafer stage step by step in the X or Y direction, and a scan operation of performing scan exposure by synchronously moving the reticle stage and the wafer stage in the Y direction. In this scan operation, the reticle stage 5 and the wafer stage 7 are synchronously moved at fixed velocities at a predetermined velocity ratio (in this embodiment, 4:1) with respect to the slit-like illuminating light and the projection optical system. In this manner, the whole pattern of the reticle 4 is transferred onto one shot region on the wafer 6 by scan exposure.

When the reticle stage 5 and the wafer stage 7 are driven, acceleration is produced by the acceleration at the start of scanning and the deceleration at the end of scanning. Therefore, the linear motor as the driving source for moving the stage must generate driving force corresponding to <mass of stage moving body>×<acceleration>. The counterforce of this driving force horizontally acts on the linear motor stator and is transmitted from the stator to the stage base member 33 via the stage surface plate supporting the stator. This counterforce is originally produced only in the horizontal direction (Y direction). However, moment is produced due to the difference between the heights of the centers of gravity of the stage driving source and the stage base member 33, so the influence of the counterforce acts on the stage base member 33 in the vertical direction as well as in the horizontal direction. If this counterforce excites the natural frequency of the mechanical system of the exposure apparatus, large vibrations are produced.

The basic technical concept of the counterforce receiving system for reducing vibrations and shaking resulting from the influence of this counterforce is to let the counterforce produced by the stage driving go to the counterforce receiving structure isolated from the floor with respect to a vibration frequency in a predetermined range. This vibration frequency in a predetermined range is, e.g., a high frequency of 10 Hz or more covering at least 20 to 40 Hz as the natural frequency of the floor. That is, this concept allows the counterforce receiving structure itself to vibrate in order to reduce the floor,vibrations. The lower-limiting value of the predetermined range is not limited to 10 Hz and can be any frequency of about 10 to 40 Hz, as long as the frequency is lower than the natural frequency of the floor.

To this end, the apparatus of this embodiment includes the stage (wafer stage 7) movable while mounting an object to be exposed, the stage base member (33) for supporting this stage, and the counterforce receiving structure (35) different from the stage base member to receive the counterforce produced when the stage is driven. With this arrangement, the apparatus interrupts the transmission of vibrations having a predetermined frequency or more between the counterforce receiving structure and the floor.

The controller 30 controls the driving of the force actuators (horizontal force actuators 39 and vertical force actuators 38) by feedforward control (predictive control) in accordance with the stage driving. This control is classified into the following two types.

First, feedforward control is performed for the force actuators in accordance with the acceleration or deceleration of the stage, thereby reducing vibrations or shaking of the stage base member 33 caused by the counterforce produced by the acceleration or deceleration. More specifically, force corresponding to force acting on each force actuator by the counterforce is predicted, and the force actuators are allowed to generate equivalent forces to cancel the counterforce. The force generated by the force actuator acts on both the stage base member 33 and the counterforce receiving structure 35. However, the counterforce receiving structure 35 is supported on the installation floor 1 or the base frame 2 by the elastic supports 36 and 37 (equivalent to mechanical filter means), so the transmission of high-frequency vibrations to the installation floor 1 is filtered.

Second, feedforward control is performed for the force actuator in accordance with load movement resulting from the movement of the stage. That is, the center of gravity of the stage changes in the horizontal direction when the stage moves, so the force which inclines the stage base member 33 acts on the stage base member 33 from the wafer stage 7. To reduce this force, localized load upon the stage movement is predicted, and the forces generated by the vertical force actuators 38 are individually changed. Although the three mounts 34 basically support the load of the stage base member 33 and the moving members on it, the force actuators actively compensate for only the change in load with the movement.

The controller 30 also performs feedback control as well as feedforward control. That is, accelerations (in the vertical and horizontal directions) detected by the acceleration sensor 40 mounted on the stage base member 33 are fed back to the control of the vertical force actuators 38 and the horizontal force actuators 39. This reduces the influence of unexpected vibrations by disturbance and further decreases shaking of the wafer stage 7.

As described above, the mounts 34 elastically fix the stage base member 33 substantially to the installation floor 1 or the base frame 2. This mount 34 is a kind of mechanical filter means and prevents the transmission of vibrations from the installation floor 1 to the stage base member 33. Accordingly, the apparatus of this embodiment is superior enough to (1) prevent the transmission of vibrations produced by the stage driving counterforce to the floor, and (2) prevent the transmission of vibrations from the floor to the stage, at the same time.

In addition to the wafer stage counterforce reducing mechanism as described above, this embodiment uses a novel step-and-scan operation sequence which can further reduce vibrations and shaking resulting from the acceleration and deceleration of the wafer stage and improve the throughput. This operation sequence will be described in detail below.

Figure 4:
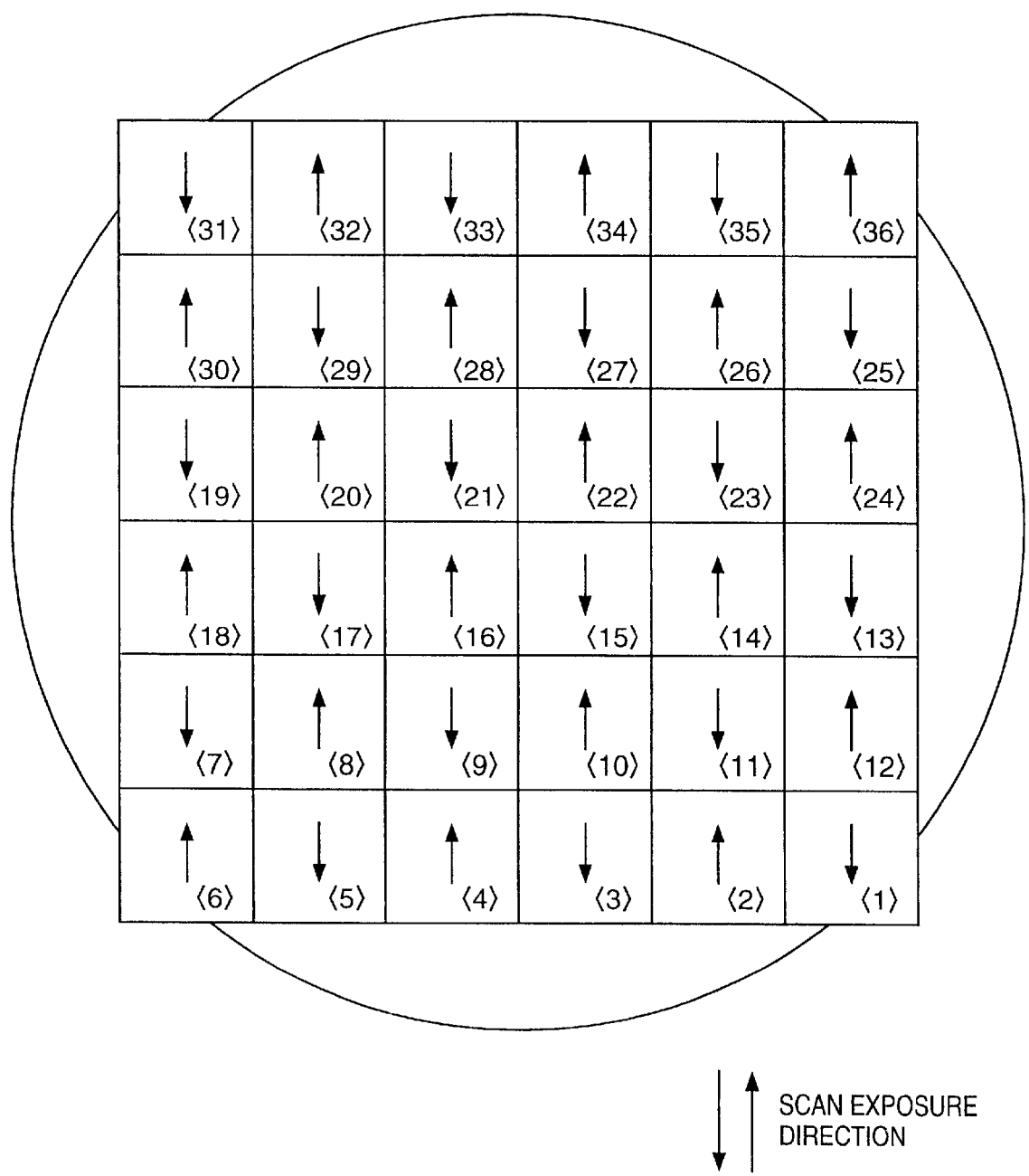
FIG. 4 is a view for explaining the step-and-scan operation sequence of a conventional apparatus.

FIG. 4 is a view for explaining a general step-and-repeat operation sequence. A first shot region <1> on a wafer is scanned upward in FIG. 4 by exposing it to slit-like exposure light along the Y direction as the scanning direction. During the exposure, a reticle moves at constant fourfold velocity in the opposite direction to the arrow. When the shot region <1> is completely exposed, the wafer moves by one shot step by step in the X direction, and a shot region <2> is exposed by scanning in the opposite direction (downward in FIG. 4). This scan exposure is repeated to a shot region <6> along one line in the X direction. The operation moves step by step to a shot region <7> in the next line, and exposure is similarly performed up to a shot region <12>. This operation is repeatedly performed up to a last shot region <36> (accordingly, 36 shots per wafer in this example). As described above, the wafer stage 1 stops—accelerates—runs at constant velocity—decelerates stops for each shot. Therefore, large counterforce is produced each time the wafer stage accelerates or decelerates for a shot, and the total throughput per wafer cannot unlimitedly improve.

Figure 2:
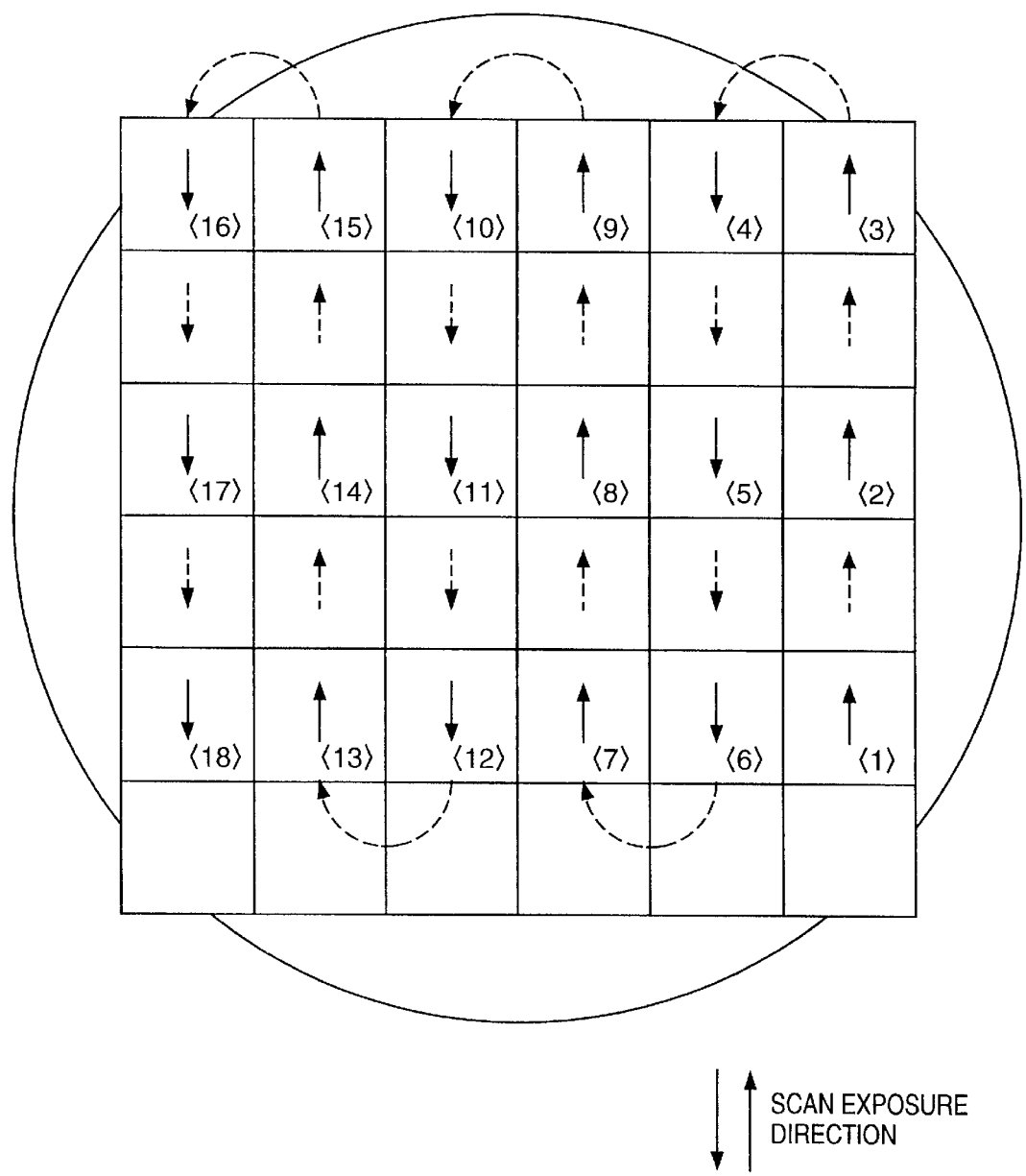
FIG. 2 is a view for explaining the step-and-scan operation sequence of the embodiment.

FIG. 2 shows the novel step-and-scan operation sequence used in this embodiment. The basic concept is to intermittently expose shot regions in one line along the scan exposure direction of a wafer stage while skipping several shot regions so as not to stop the wafer stage. That is, the exposure apparatus includes the reticle stage 5 for holding the reticle 4, the wafer stage 7 for holding the wafer 6, and the projection optical system 9 for projecting a pattern of the reticle 4 onto the wafer 6. This exposure apparatus performs exposure by scanning both the reticle stage 5 and the wafer stage 7 with respect to the projection optical system 9 and transfers the pattern of the reticle 4 onto a plurality of shot regions in order. The apparatus intermittently exposes the shot regions arranged along the scan exposure direction on the wafer by moving the wafer stage 7 by scanning without stopping it. "Intermittent exposure" means that a plurality of shot regions arranged in the scanning direction on the wafer 6 are exposed in order by scanning while one or more shot regions are skipped without being exposed. During the period of skipping, the reticle stage 5 is returned in the opposite direction to the direction of scanning.

Referring to FIG. 2, a first shot region <1> is exposed by scanning along the Y direction as the scanning direction. After that, the wafer is kept moved to skip the adjacent shot region, and a shot region <2> is exposed by scanning. During the skipping, irradiation of the exposure light to at least the wafer is stopped. This is done by controlling the light-shielding member (e.g., the variable blind, masking blade, or shutter) of the illuminating optical system to close the member in a non-exposure region (at non-exposure time), thereby shielding the exposure light. When the shot region <2> is completely scanned, the next shot region is skipped, and a shot region <3> is exposed by scanning. In this manner, a plurality of shot regions in one line along the Y direction as the scanning direction are alternately exposed in the order of the shot regions <1>, <2>, and <3>. During the exposure, the wafer stage moves at constant velocity without stopping. Consequently, counterforce is produced only by acceleration before the first shot region <1> and deceleration after the exposure of the last shot region <3>. The reticle stage returns by moving in the opposite direction to the scanning direction while the wafer stage is moving to skip shot regions not to be exposed (indicated by dotted lines in FIG. 2)

Figure 3:
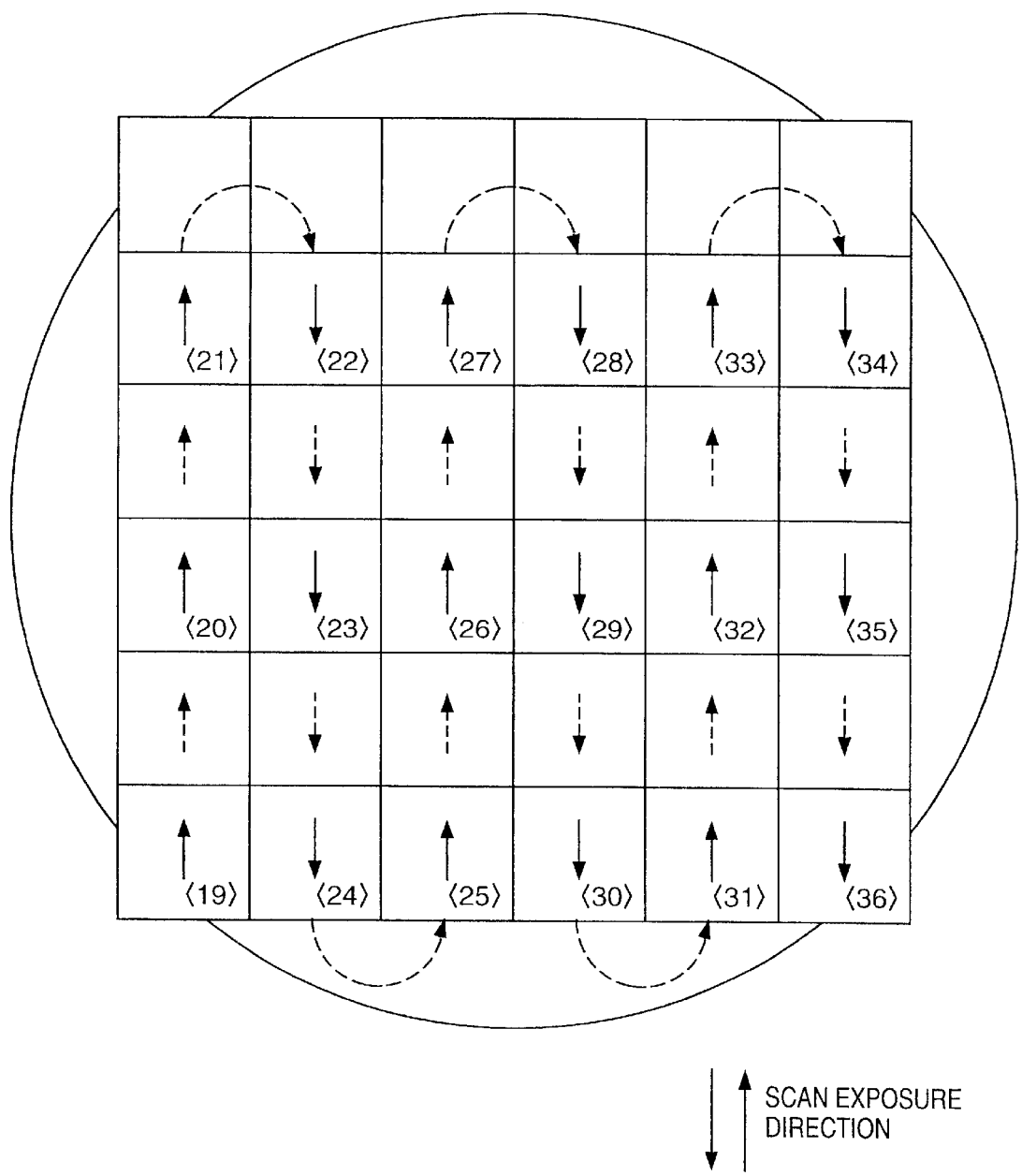
FIG. 3 is a view for explaining the step-and-scan operation sequence of the embodiment

When the shot regions <1>, <2>, and <3> in one line are completely exposed, the wafer is moved one line in the X direction with respect to the projection optical system, thereby setting a new line. Shot regions <4>, <5>, and <6> are similarly exposed, this time downward in FIG. 2, in the order named. When the lines are changed, the velocity and acceleration of the wafer stage are changed. However, the wafer stage can keep moving at constant velocity without stopping in the rest of the operation. Regions up to a shot region <18> are thus exposed to complete exposure of the half of all shots on one wafer. Next, shot regions <19> to <36> are exposed following the same procedure as above in the order as shown in FIG. 3 while the exposed shot regions are skipped. That is, the skipped shot regions are similarly exposed later while the exposed shot regions are skipped. When all shot regions on the wafer are completely exposed, this wafer is replaced with another, and the operation is repeated in the same manner.

Figure 5A:
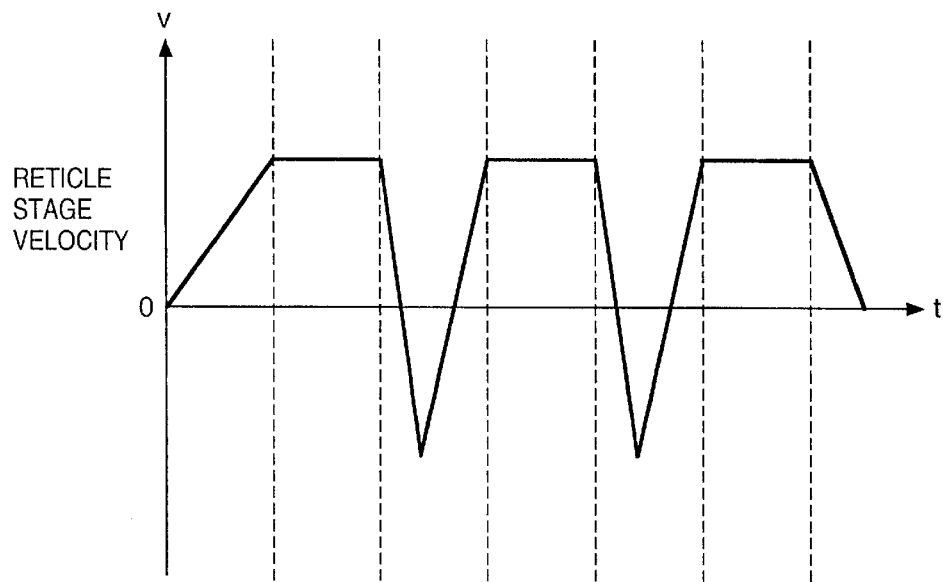
FIGS. 5A and 5B are graphs showing velocity changes of stages in the embodiment.
Figure 5B:
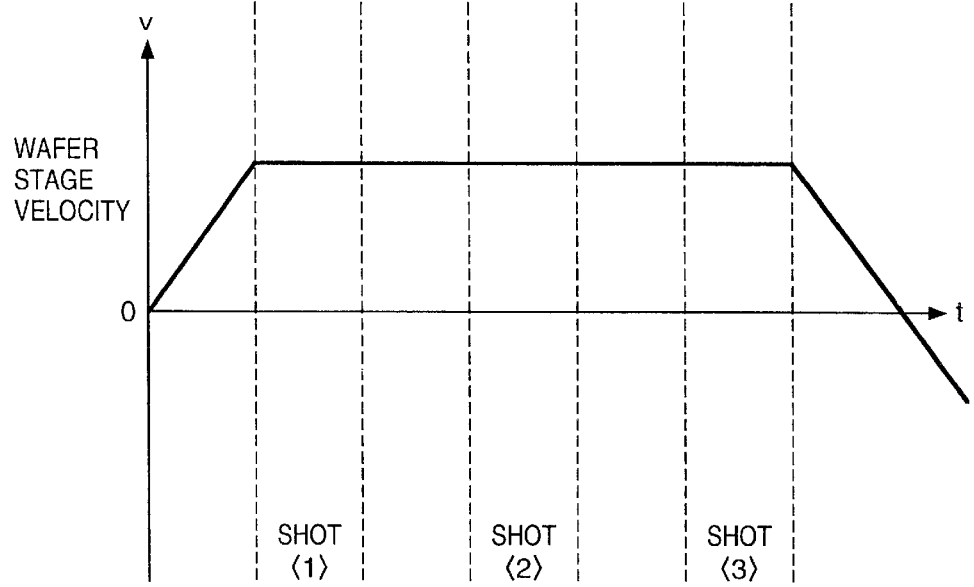
Figure 6A:
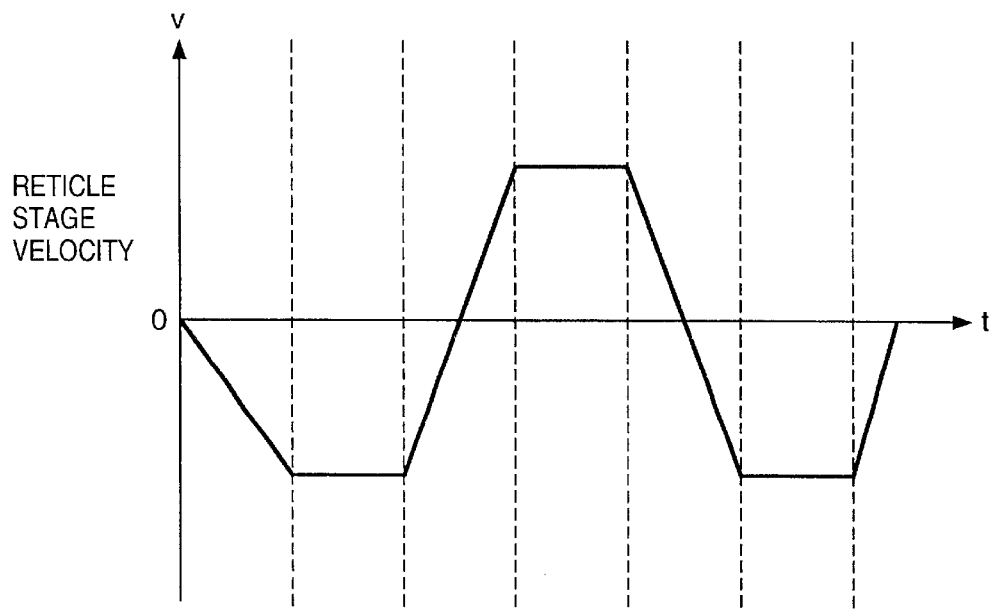
FIGS. 6A and 6B are graphs showing velocity changes of general stages.
Figure 6B:
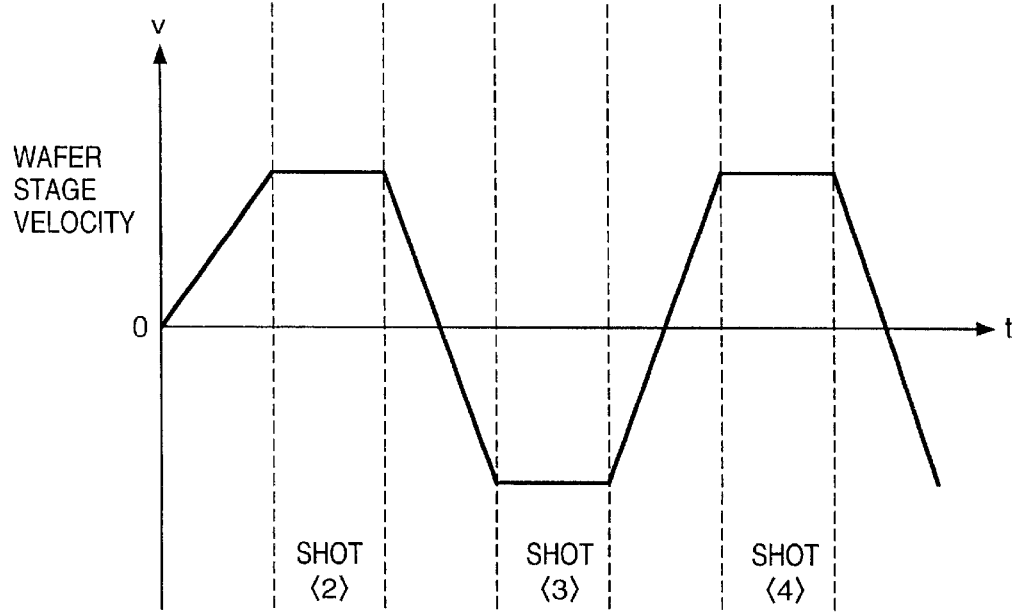

FIGS. 5A and 5B show the changes in driving velocities of the reticle stage and the wafer stage when one line (three shots) is exposed in this embodiment (FIGS. 2 and 3). For comparison, FIGS. 6A and 6B show the changes in velocities of the two stages when the general stage driving (FIG. 4) is performed. In FIGS. 5A to 6B, the time is plotted along the abscissa, and the velocity is plotted along the ordinate.

The comparison of these drawings indicate that the reticle stage repetitively accelerates and decelerates for each shot in both the driving methods, whereas the wafer stage moves at constant velocity for each shot in FIG. 5B but repetitively accelerates and decelerates for each shot in FIG. 6B. That is, in this embodiment, the velocity of the wafer stage remains unchanged and the zero acceleration period is very long during exposure of shots in one line. Since the vibrating force generated by the wafer stage is proportional to the magnitude of acceleration, vibrations of the apparatus caused by the wafer stage can be reduced.

On the other hand, the acceleration (the slope of the curve) of the reticle stage shown in FIG. 5A must be larger than that shown in FIG. 6A. However, compared to the wafer stage driven along the two, X- and Y-axes and having a large mass, the reticle stage is driven along one axis and has a small mass. Therefore, the construction of the vibration reducing mechanism of the reticle stage is relatively simple. Also, the mechanism for obtaining large acceleration is simpler than that of the wafer stage. Accordingly, the merit that the number of acceleration and deceleration times of the wafer stage reduces is more important. Especially when the acceleration of the wafer stage cannot sufficiently increase due to the influence of vibrations or thrust, higher throughput can be obtained by this embodiment. In conclusion, the combined effect of the step-and-scan operation sequence of this embodiment and the wafer stage counterforce reducing mechanism using the aforementioned counterforce receiving structure achieves a scanning exposure apparatus very superior in solving vibration problems.

Exposure need not be performed on every other shot region as described above. That is, exposure can also be performed by skipping n (natural number) shots, e.g., two or three shot regions. Since this produces a time margin for the return of the reticle stage, the load on the reticle stage can be reduced. For example, the number of shot regions to be skipped can be calculated by using, as parameters, the maximum acceleration and maximum velocity of the reticle stage, the maximum acceleration and maximum velocity of the wafer stage, and the size and number of exposure shots. More specifically, from these parameters previously known before exposure, throughputs are calculated by attaching importance to each of accuracy and throughput. In this way, an optimum exposure order can be automatically determined.

Also, the wafer stage need not always move at constant velocity, i.e., the wafer stage velocity can be changed when a shot region not to be exposed is skipped. For example, when the reticle stage has satisfactory acceleration/deceleration performance or when exposure is performed by skipping two or more shot regions, the wafer stage velocity during the skipping is made higher than that during the exposure scanning. This improves the total throughput per wafer. Additionally, when the wafer stage velocity during the skipping is lower than that during the exposure scanning, the return of the reticle stage during the skipping can be given a certain time margin. This reduces the load on the reticle stage.

Furthermore, while a certain shot region is skipped without being exposed (indicated by any dotted arrow in FIG. 2), an alignment mark in this shot indicated by the arrow is measured, and alignment is performed by slightly moving the wafer stage by using this alignment measurement value immediately before the next shot is exposed. Consequently, the positional deviation of the adjacent shot can be reflected on a shot to be exposed next without lowering the throughput. So, high-accuracy alignment can be realized. Additionally, if this measurement value of a skipped shot is stored, the value can be directly used when the skipped shot region is exposed later. Accordingly, die-by-die shot alignment can be suitably performed in the skipped shot.

Figure 7:
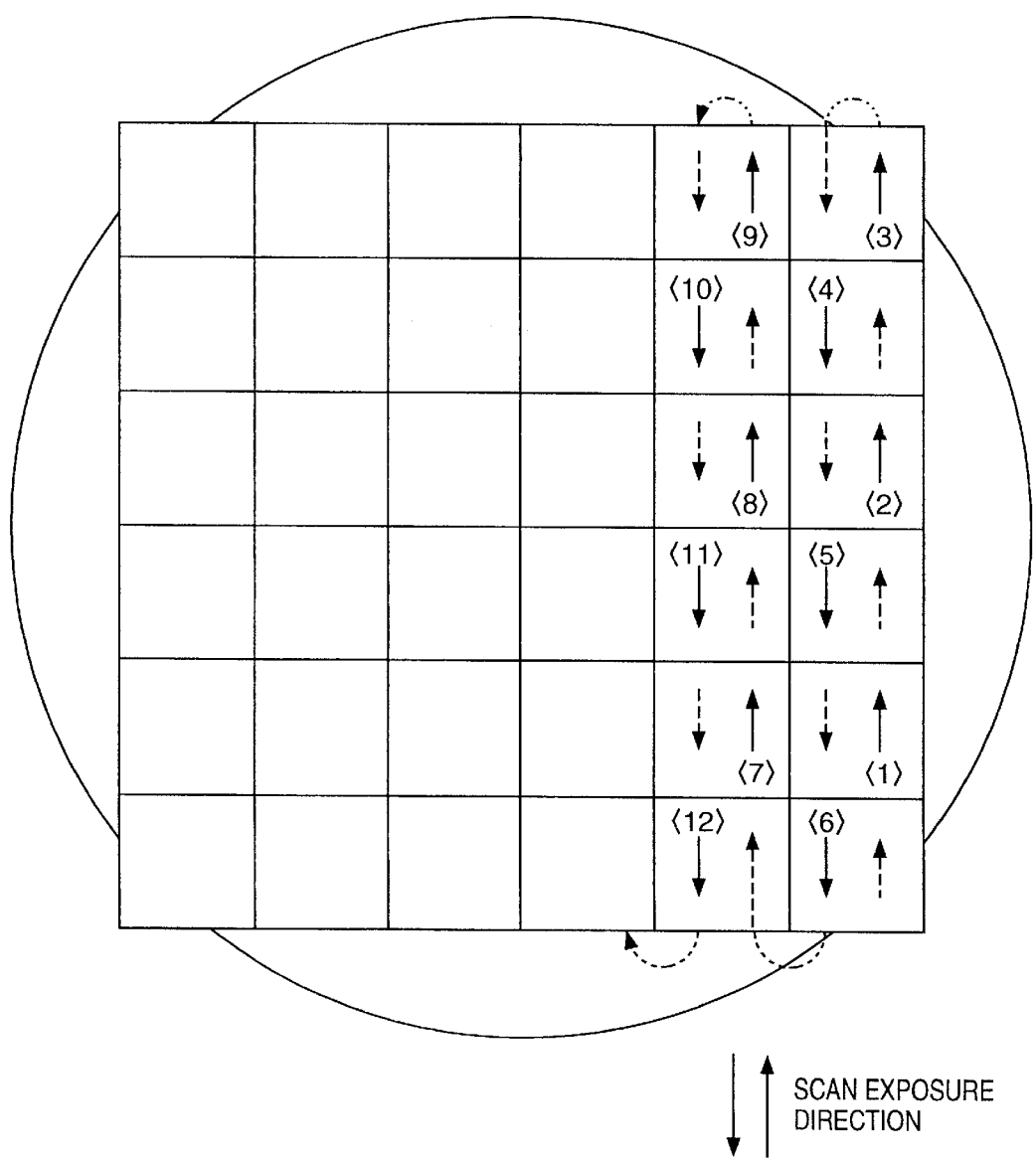
FIG. 7 is a view for explaining the step-and-scan operation sequence of another embodiment.

The accuracy can be further improved by adding position information of each shot to position information of the shot previously obtained by global alignment. If this is the case, an operation sequence (by which shot regions in one line are exposed by continuous reciprocal scanning) shown in FIG. 7 is used. Consequently, the time from the alignment mark measurement to the exposure can be shortened. This advantageously improves the accuracy because the influence of temperature variations or atmospheric pressure variations can be reduced.

Furthermore, while a shot region is skipped, it is preferable not only to perform the alignment measurement but also to measure and store the focus position of a wafer. This stored focus position is used when the skipped shot region is exposed later. Consequently, the time required to drive the wafer stage to the best focus position can also be shortened.

In the above explanation, one reticle is used for one layer of a wafer and transferred onto a plurality of shot regions in order. However, this embodiment is also applicable to a multiple exposure system (double exposure when two reticles are used) in which two or more different reticles are prepared for one layer and these reticle patterns are transferred onto the same shot region by exposure.

Figure 10:
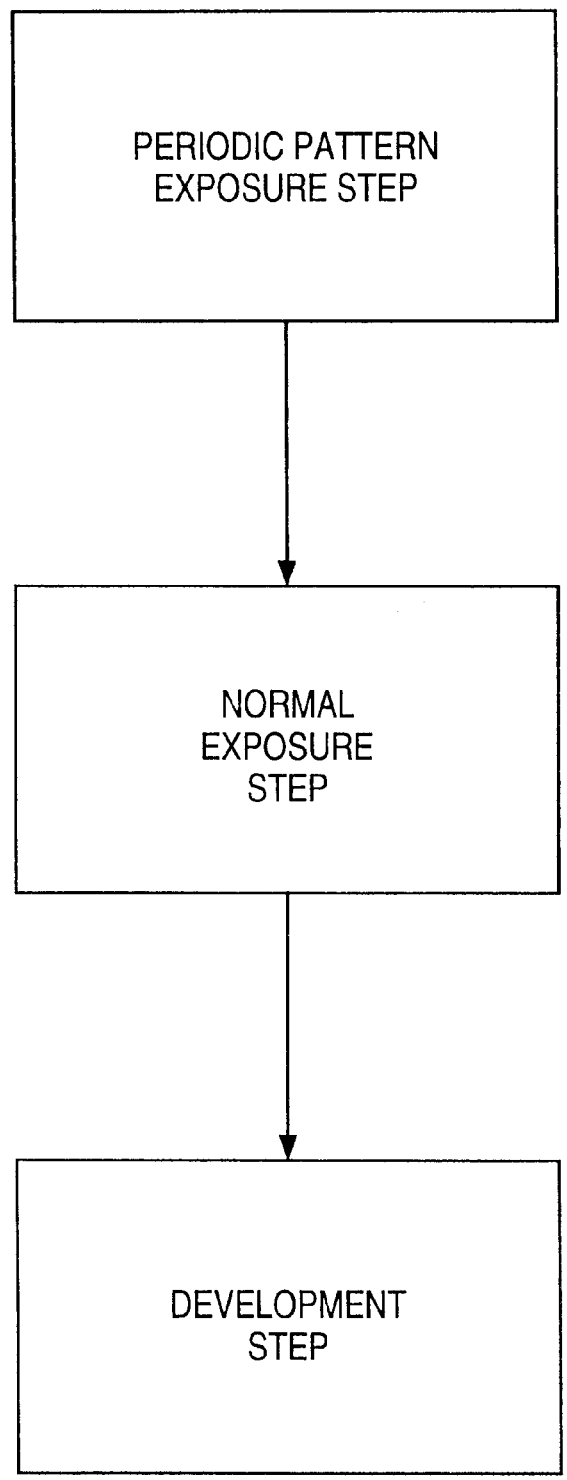
FIG. 10 is a view for explaining the procedure of multiple exposure (double exposure)

This is done by a procedure as shown in FIG. 10. For example, a reticle A is used to transfer a periodic pattern such as a line-and-space pattern, and a reticle B is used to transfer an isolated pattern such as a normal circuit pattern. These periodic pattern exposure step and normal exposure step are sequentially performed to perform double exposure, and development is performed after that. The order of these periodic pattern exposure step and normal exposure step can be reversed. In this manner, only a portion where the resist threshold value exceeds the total exposure amount of the two patterns is developed. Consequently, it is possible to perform pattern transfer having higher resolution than the resolution of an exposure apparatus used.

In this double exposure, the time interval from the completion of the exposure of the periodic reticle pattern of the reticle A in the periodic pattern exposure step to the timing at which the pattern of the reticle B is superposed by exposure in the next normal exposure step is preferably substantially constant for all shots and as short as possible. This is so because the chemical change of the resist caused by irradiation of the exposure light progresses over time. If this time interval is not substantially constant for all shots, the resolution may vary from one shot to another.

To realize this, therefore, a multiple exposure method is preferably performed as follows. First, the reticle A is used to expose shot regions in order following the procedure shown in FIG. 7. When the exposure of a shot <6> is complete, the reticles are exchanged, and the reticle B is used to expose the same line in the same order following the same procedure. When the multiple exposure of one line is thus complete, the same procedure is repetitively performed for the next line. In this manner, the interval between the periodic pattern exposure and the normal exposure can be reduced to a relatively short time and held substantially constant for all shots.

In this multiple exposure, it is not always necessary to scan the reticle stage to transfer the line-and-space periodic pattern by using the reticle A. That is, if this line-and-space pattern is long along the scanning direction, the line-and-space pattern can be transferred by exposure by scanning only the wafer stage while the pattern of the reticle A is kept stopped on the exposure slit.

Figure 9:
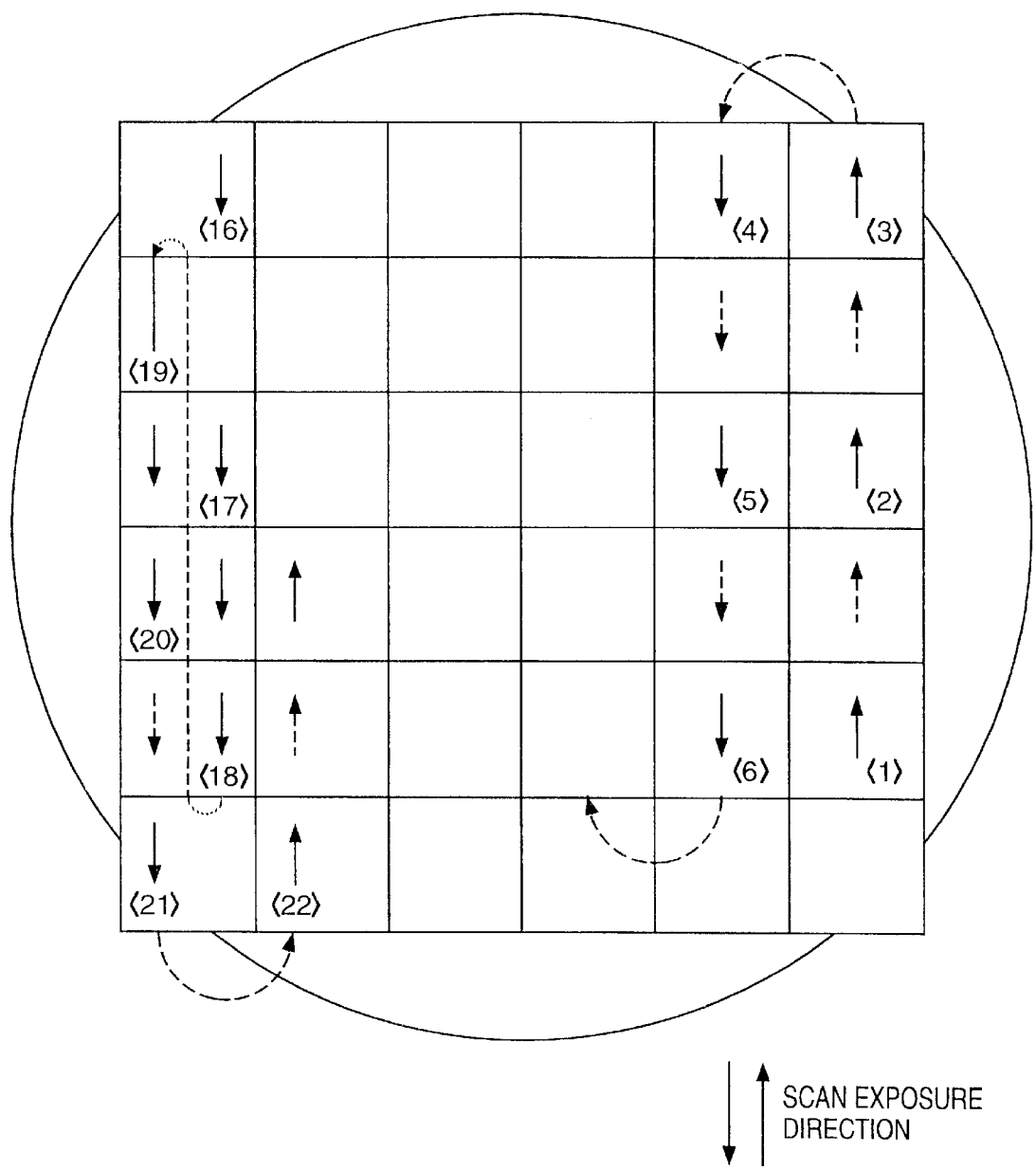
FIG. 9 is a view for explaining the step-and-scan operation sequence of another embodiment.

If this is the case, it is advantageous to expose the periodic pattern of the reticle A continuously in the longitudinal direction as shown in FIG. 8 for the sake of throughput. Also, in exposing the isolated pattern of the reticle B, as shown in FIG. 9, it is advantageous to make the wafer stage behavior as close as possible to that in the pattern exposure of the reticle A for the sake of alignment accuracy. In multiple exposure, very high alignment accuracy is necessary over individual exposure steps. When the exposure order shown in FIG. 9 is used, the direction of exposure scanning using the reticle A shown in FIG. 8 matches the direction of exposure scanning using the reticle B, and high alignment accuracy can be achieved. Furthermore, the reticle A need not always be prepared for the line-and-space periodic pattern. For example, a small member having the pattern can also be placed on the reticle stage.

<Device Fabrication Method>

Figure 11:
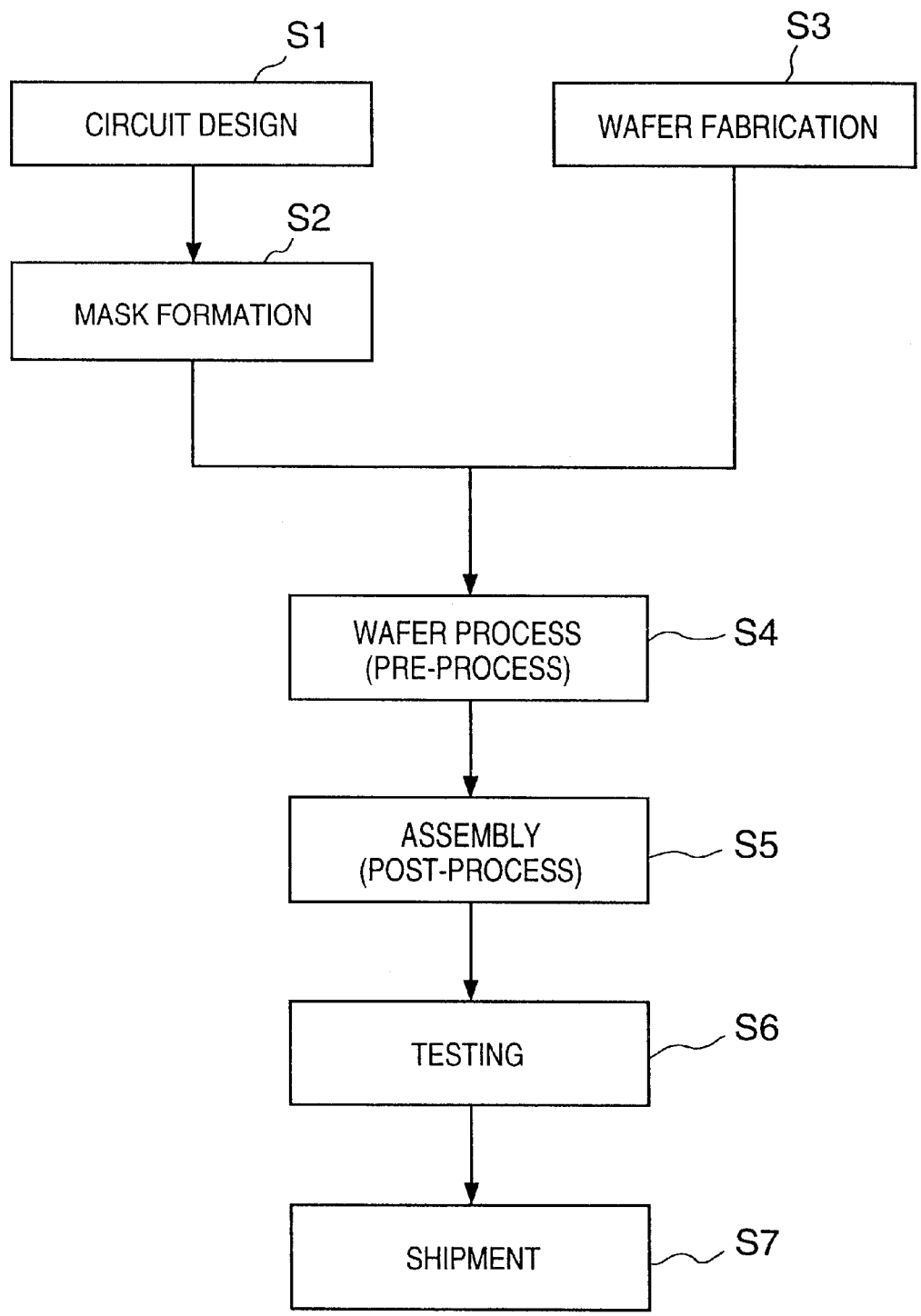
FIG. 11 is a flow chart showing a semiconductor device fabrication flow.

A device fabrication method using the abovementioned exposure apparatus will be described below. FIG. 11 shows the flow of fabrication of a microdevice (e.g., a semiconductor chip such as an IC or LSI, liquid crystal panel, CCD, thin film magnetic head, or micromachine). In step 1 (circuit design), a pattern of the device is designed. In step 2 (reticle formation), a reticle having the designed pattern is formed. In step 3 (substrate fabrication), a substrate is fabricated by using a material such as silicon or glass. Step 4 (substrate process) is called a pre-process in which the prepared reticle and substrate are used to form an actual circuit on the substrate by lithography. Step 5 (assembly) is called a post-process in which a semiconductor chip is formed by using the substrate fabricated in step 4. This step 5 includes an assembly step (dicing and bonding), a packaging step (chip encapsulation), and the like. In step 6 (testing), operation test, durability test, and the like are performed for the semiconductor device fabricated in step 5. The semiconductor device is completed through these steps and shipped (step 7).

FIG. 12 shows the detailed flow of the substrate process described above. In step 11 (oxidation), the substrate surface is oxidized. In step 12 (CVD), an insulating film is formed on the substrate surface. In step 13 (electrode formation), electrodes are formed on the substrate by vapor deposition. In step 14 (ion implantation), ions are implanted into the substrate. In step 15 (resist processing), the substrate is coated with a resist. In step 16 (exposure), the aforementioned exposure apparatus is used to transfer the reticle circuit pattern onto a plurality of shot regions on the substrate by baking exposure. In step 17 (development), the exposed substrate is developed. In step 18 (etching), a portion except for the developed resist image is etched away. In step 19 (resist removal), the resist which is unnecessary after the etching is removed. These steps are repetitively performed to form multiple circuit patterns on the substrate. When the production method of this embodiment is used, high-accuracy devices which are not easily fabricated by the conventional methods can be fabricated with high productivity, i.e., low cost.

In the exposure apparatus of the present invention, the number of acceleration and deceleration times of the wafer stage decreases. Therefore, the influence of vibrations and shaking reduces, so higher accuracy than in the conventional apparatuses can be achieved, and high throughput can also be obtained. Additionally, by decreasing the influence which the counterforce produced by the acceleration and deceleration of the wafer stage has on the floor, the influence on other apparatuses installed on the same floor can be decreased. Furthermore, a device fabrication method with high productivity can be provided by the use of the exposure apparatus of the present invention.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus comprising;
   a reticle stage for holding a reticle;
   a wafer stage for holding a wafer;
   a projection optical system for projecting a pattern of the reticle onto the wafer; and
   exposing means for moving said reticle stage and said wafer stage with respect to said projection optical system and projecting the pattern of the reticle onto a plurality of shot regions on the wafer by exposure,
   wherein said exposing means performs intermittent projection exposure where the plurality of shot regions arranged in a moving direction of said wafer stage perform projection exposure intermittently at intervals of at least one shot region at the same time as one continuous moving of said wafer stage in the same moving direction.

2. The apparatus according to claim 1, further comprising means for moving said reticle stage in an opposite direction to a direction of the projection exposure in a shot region skip period.

3. The apparatus according to claim 1, wherein said exposing means exposes a plurality of shot regions arranged in the moving direction of said wafer stage a plurality of number of times and executes the intermittent projection exposure in each exposure, thereby executing projection exposure for unexposed shot regions while skipping exposed shot regions.

4. The apparatus according to claim 1, wherein said exposing means holds velocity of said wafer stage constant throughout the projection exposure and a skip period.

5. The apparatus according to claim 1, wherein said exposing means makes velocities of said wafer stage during the projection exposure and a slip period different from each other.

6. The apparatus according to claim 1, further comprising measuring means for measuring a position of a shot region to be skipped to obtain position information during a skip period.

7. The apparatus according to claim 6, wherein said measuring means obtains the position information of the shot region by one of alignment measurement and focus measurement.

8. The apparatus according to claim 6, wherein said exposing means uses a result of the measurement by said measuring means in exposure of a next shot region or in exposure control for an adjacent shot region.

9. The apparatus according to claim 6, wherein said apparatus further comprises storage means for storing a result of the measurement by said measuring means, and
   said exposing means uses the measurement result stored in said storage means when performing projection exposure for a skipped shot region later.

10. The apparatus according to claim 6, wherein said exposing means performs the alignment by adding the position information of each shot region measured by said measuring means to position information of the shot region previously obtained by global alignment.

11. The apparatus according to claim 10, wherein said exposing means performs the alignment by adding the position information of each shot region measured by said measuring means to position information of the shot region previously obtained by global alignment.

12. The apparatus according to claim 1, wherein said exposing means performs multiple exposure for each shot region by using a plurality of reticles.

13. The apparatus according to claim 12, wherein said exposing means performs the multiple exposure by using a first reticle for projecting a line-and-space periodic pattern by exposure and a second reticle for projecting an isolated pattern by exposure.

14. The apparatus according to claim 13, wherein said exposing means controls such that a time interval between the projection exposure by the first reticle and the projection exposure by the second reticle is substantially constant for all shot regions.

15. The apparatus according to claim 14, wherein said exposing means performs the projection exposure of the line-and-space pattern by the first reticle by moving said wafer stage with said reticle stage being kept stopped.

16. The apparatus according to claim 1, further comprising an illuminating system for illuminating the reticle, said illuminating system having a light-shielding member capable of interrupting the illumination when no exposure is performed during the intermittent projection exposure.

17. The apparatus according to claim 16, further comprising an excimer laser as a light source of said illuminating system.

18. The apparatus according to claim 1, further comprising a reducing mechanism for reducing influence of counterforce when said wafer stage or said reticle stage is driven.

19. The apparatus according to claim 18, wherein said reducing mechanism comprises a stage base member for supporting said wafer stage, and a counterforce receiving structure different from said stage base member to receive counterforce when said wafer stage is driven.

20. The apparatus according to claim 19, wherein transmission of vibrations having not less than a predetermined frequency is interrupted between said counterforce receiving structure and a floor.

21. The apparatus according to claim 20, further comprising an elastic support for elastically supporting said counterforce receiving structure with respect to the floor or abase frame, said elastic support interrupting the vibration transmission.

22. The apparatus according to claim 21, wherein said elastic support is arranged in one of a vertical direction and a horizontal direction.

23. The apparatus according to claim 20, further comprising a force actuator for generating force between said stage base member and said counterforce receiving structure.

24. The apparatus according to claim 23, wherein said elastic support is arranged in one of a vertical direction and a horizontal direction.

25. The apparatus according to claim 23, wherein said force actuator is a linear motor.

26. The apparatus according to claim 23, wherein a height of a center of gravity of said wafer stage is substantially equal to a height of a force acting position of said force actuator.

27. The apparatus according to claim 19, wherein said reducing mechanism further comprises a mount for elastically supporting said stage base member substantially to the floor or the base frame.

28. The apparatus according to claim 19, wherein said counterforce receiving structure is positioned below said stage base member.

29. The apparatus according to claim 20, wherein the predetermined frequency is not more than a natural frequency of the floor.

30. The apparatus according to claim 20, wherein the predetermined frequency is higher than 10 Hz.

31. A device fabrication method of fabricating a device, comprising the steps of:

preparing an exposure apparatus according to claim 1; and exposing a substrate by using said exposure apparatus.

32. The method according to claim 31, further comprising the steps of:

coating said substrate with a resist before the exposure; and developing the substrate after the exposure.

33. A method of controlling an exposure apparatus comprising a reticle stage holding a reticle, a wafer stage for holding a wafer, and a projection optical system for projecting a pattern of the reticle onto the wafer, comprising:

an exposure step of moving said reticle stage and said wafer stage with respect to said projection optical system and projecting the pattern of the reticle onto a plurality of shot regions on the wafer by exposure, and performing intermittent projection exposure where the plurality of shot regions arranged in a moving direction of said wafer stage perform exposure intermittently at intervals of at least one shot region at the sane time as one continuous moving of said wafer stage in the same moving direction.

34. The method according to claim 33, further comprising the step of moving said reticle stage in an opposite direction to a direction of the projection exposure in a shot region skip period.

35. The method according to claim 33, wherein the exposure step comprises exposing a plurality of shot regions arranged in the moving direction of said wafer stage a plurality of number of times, and executing die intermittent projection exposure in each exposure, thereby executing projection exposure for unexposed shot regions while exposed shot regions are skipped.

36. The method according to claim 33, wherein the exposure step comprises holding velocity of said wafer stage constant throughout the projection exposure and a skip period.

37. The method according to claim 33, wherein the exposure step comprises making velocities of said wafer stage during the projection exposure and a skip period different from each other.

38. The method according to claim 33, further comprising the measurement step of measuring a position of a shot region to be skipped to obtain position information during a skip period.

39. The method according to claim 38, wherein the measurement step comprises obtaining the position information of the shot region by one of alignment measurement and focus measurement.

40. The method according to claim 38, wherein the exposure step comprises using a result of the measurement in the measurement step in exposure of a next shot region or in exposure control for an adjacent shot region.

41. The method according to claim 39, wherein said method further comprises a storage step of storing a result of the measurement in the measurement step into a memory, and the exposure step comprises using the measurement result stored in said memory when projection exposure is performed for a skipped shot region later.

42. The method according to claim 38, wherein the exposure step comprises performing alignment for each shot region by a die-by-die mode on the basis of the position information obtained in the measurement step.

43. The method according to claim 42, wherein the exposure step comprises performing the alignment by adding the position information of each shot region measured by said measuring means to position information of the shot region previously obtained by global alignment.

44. The method according to claim 42, wherein the exposure step comprises performing multiple exposure for each shot region by using a plurality of reticles.

45. The method according to claim 44, wherein the exposure step comprises performing the multiple exposure by using a first reticle for projecting a line-and-space periodic pattern by exposure and a second reticle for projecting an isolated pattern by exposure.

46. The method according to claim 45, wherein the exposure step comprises performing control such that a time interval between the projection exposure by the first reticle and the projection exposure by the second reticle is substantially constant for all shot regions.

47. The method according to claim 46, wherein the exposure step comprises performing the projection exposure of the line-and-space pattern by the first reticle by moving said wafer stage with said reticle stage being kept stopped.

* * * * *

UNITED STATES PATENT AND TRADEMARK OFFICE
CERTIFICATE OF CORRECTION

PATENT NO. : 6,342,942 B1
DATED : January 29, 2002
INVENTOR(S) : Shigeyuki Uzawa It is certified that error appears in the above-identified patent and that said Letters Patent is hereby corrected as shown below:

<u>Title page,</u>
ABSTRACT,
Line 2, "and" should read -- and a --.

<u>Column 1,</u>
Line 19, "plate." should read -- plate --.

<u>Column 6,</u>
Line 9, the second occurrence of "spring," should read -- coil spring, --.
Line 12, "damping" should read -- damper --.

<u>Column 7,</u>
Line 62, "moment" should read -- a moment --.

<u>Column 8,</u>
Line 12, "floor,vibrations." should read -- floor vibratons. --.

<u>Column 9,</u>
Line 32, "velocity-decelerates stops" should read -- velocity—decelerates—stops --.

<u>Column 10,</u>
Line 52, "two," should read -- two --.

<u>Column 12,</u>
Line 2, "These" should read -- The --.
Line 4, "these" should read -- the --.

<u>Column 13,</u>
Line 47, "comprising;" should read -- comprising: --.

<u>Column 14,</u>
Line 3, "plurality of" should be deleted.
Line 12, "slip" should read -- skip --.
Line 34, the first occurrence of "the" should be deleted; and "by adding the" should read -- for each shot region by a die-by-die mode on the basis of the position information obtained by said measuring means. --
Line 35-37, should be deleted.

UNITED STATES PATENT AND TRADEMARK OFFICE
CERTIFICATE OF CORRECTION

PATENT NO. : 6,342,942 B1
DATED : January 29, 2002
INVENTOR(S) : Shigeyuki Uzawa It is certified that error appears in the above-identified patent and that said Letters Patent is hereby corrected as shown below:

<u>Column 15,</u>
Line 16, "abase" should read -- a base --.
Line 56, the first occurrence of "stage" should read -- stage for --.
Line 67, "sane" should read -- same --.

<u>Column 16,</u>
Line 9, "plurality of" should be deleted; and "die" should read -- the --.

Signed and Sealed this

Fourth Day of June, 2002

*Attest:*

*Attesting Officer*

JAMES E. ROGAN
*Director of the United States Patent and Trademark Office*